United States Patent
Aufiero

[11] Patent Number: 5,882,286
[45] Date of Patent: Mar. 16, 1999

[54] DRILLING UNIT FOR PRINTED CIRCUIT BOARDS HAVING TWO OPERATING HEADS

[75] Inventor: Giacomo Aufiero, Castellamonte, Italy

[73] Assignee: Pluritec Italia S.p.A., Borgomanero, Italy

[21] Appl. No.: 30,731

[22] Filed: Feb. 25, 1998

[30] Foreign Application Priority Data

Jul. 4, 1997 [IT] Italy ................................. TO97A0596

[51] Int. Cl.⁶ ............................. B23Q 3/157; B23Q 5/40; B23B 39/08
[52] U.S. Cl. ............................... 483/55; 408/43; 408/46; 408/53; 409/202; 409/212
[58] Field of Search .................... 483/54, 55, 56, 483/57; 408/42, 43, 46, 50, 69, 52, 3, 70; 409/202, 212; 29/26 A

[56] References Cited

U.S. PATENT DOCUMENTS

| 3,663,114 | 5/1972 | Welsh et al. ................................. 408/3 |
| 3,918,825 | 11/1975 | Alberti ...................................... 408/43 |
| 4,088,417 | 5/1978 | Kosmonski .......................... 408/52 X |
| 4,596,067 | 6/1986 | Raiterl .................................... 483/57 X |
| 4,715,108 | 12/1987 | Sugiyama et al. ......................... 483/54 |
| 4,761,876 | 8/1988 | Kosmonski ............................. 483/54 X |
| 5,111,573 | 5/1992 | Ito et al. .................................. 483/56 |
| 5,230,685 | 7/1993 | Christen et al. .......................... 403/55 |
| 5,354,153 | 10/1994 | Ottone et al. ......................... 408/69 X |
| 5,584,788 | 12/1996 | Provano .............................. 409/212 X |

FOREIGN PATENT DOCUMENTS 2012816  8/1992  WIPO ..................................... 408/43

*Primary Examiner*—William Briggs
*Attorney, Agent, or Firm*—Sheridan Ross P.C.

[57] ABSTRACT

The drilling unit comprises a cross-piece secured to the base and two carriages supporting said two operating heads and sliding on said cross-piece. The two carriages are each displaced independently of one another along the axis by means of two nut and screw pairs, each of which is associated with one of the carriages. The screw of each nut and screw pairs is actuated by a corresponding reversible electric motor mounted on the cross-piece, whereas the nut is mounted on the corresponding carriage displaced outwards with respect to the head so as to allow the heads to move individually into a common machining zone on the table.

14 Claims, 4 Drawing Sheets

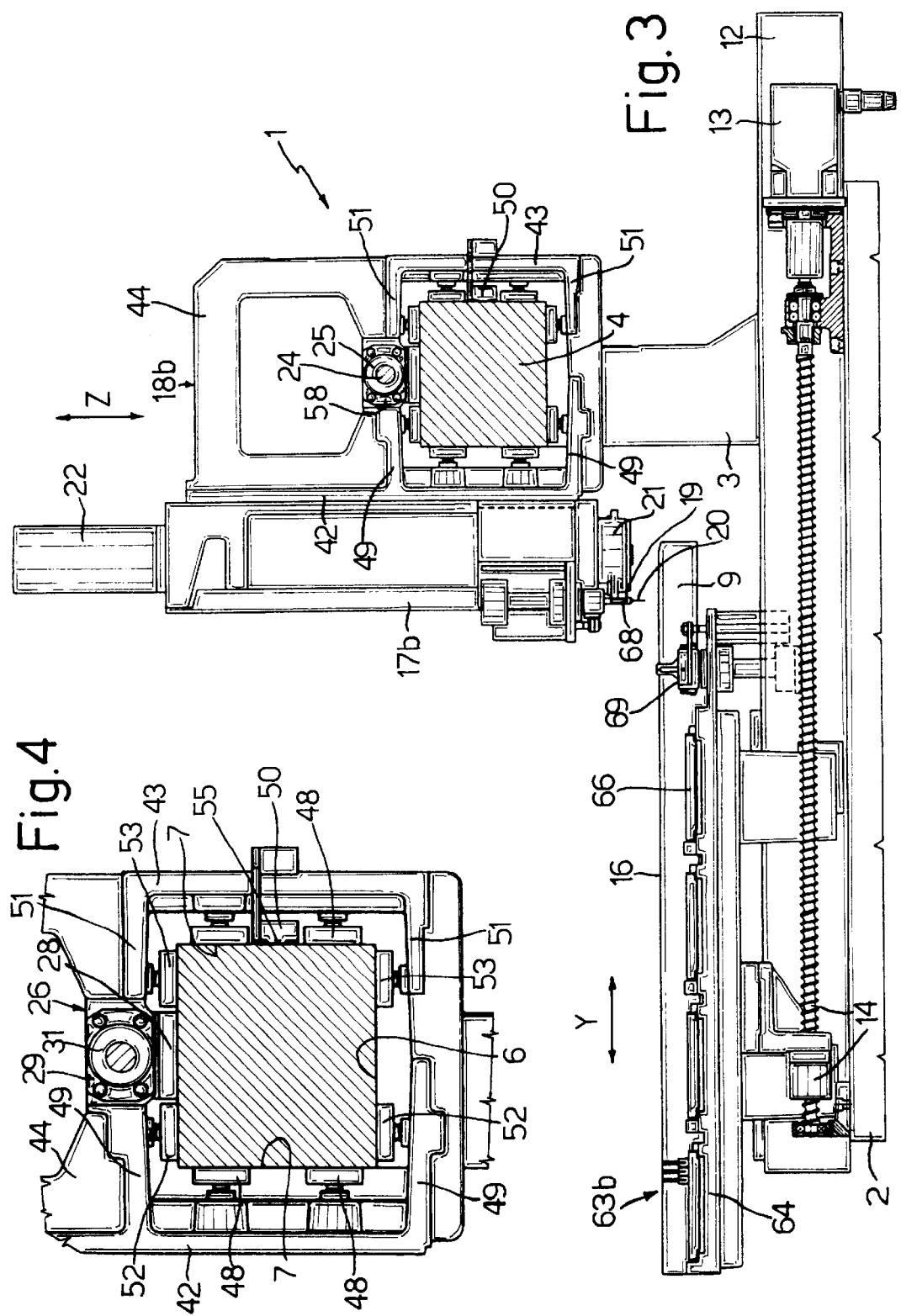

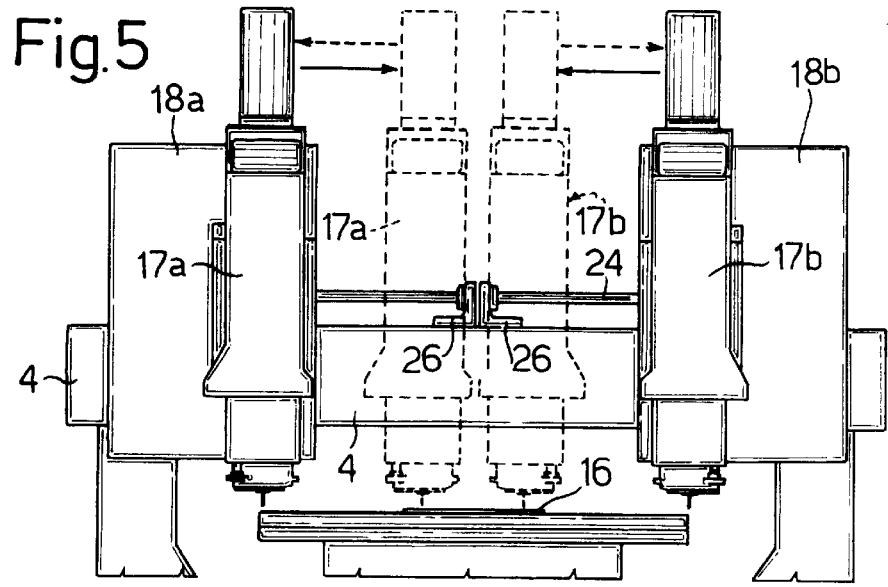
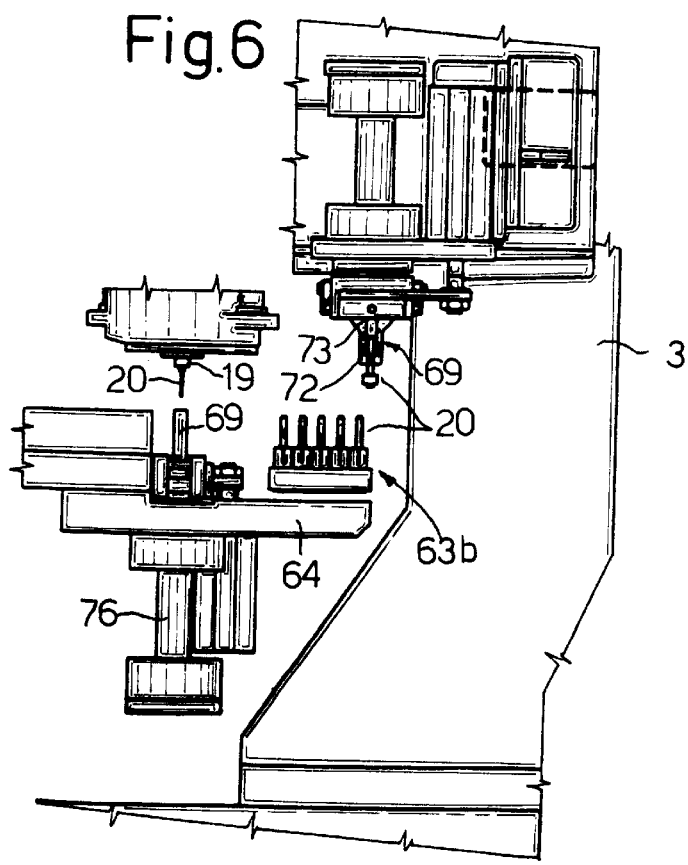
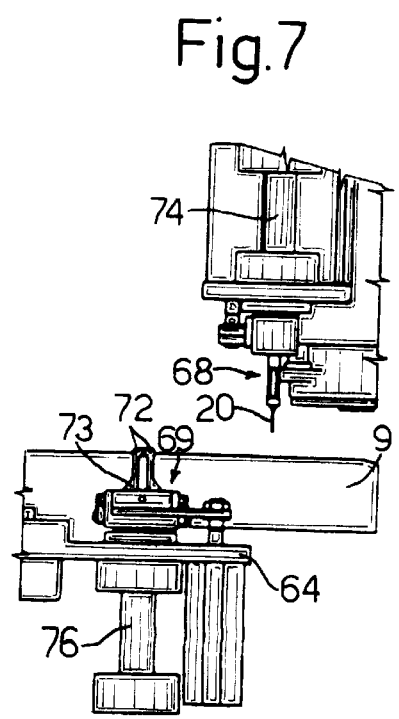

DRILLING UNIT FOR PRINTED CIRCUIT BOARDS HAVING TWO OPERATING HEADS

BACKGROUND OF THE INVENTION

The present invention relates to a drilling unit for printed circuit boards having two operating heads.

The machining of printed circuit boards increasingly necessitates operating machines with high levels of versatility and productivity. For this purpose drilling machines have been proposed which are provided with a series of operating heads adapted to drill simultaneously a corresponding series of like boards. These machines, although having high productivity, are generally not very versatile, particularly in the case of boards of greater width than the distance provided between the operating heads.

Modular drilling units have also been proposed, which can optionally be connected to a single control unit with a view to adapting the size of each installation to the respective production requirements. However, each drilling unit operates like a drilling machine with a single operating head, in which case the relative productivity is comparatively low.

A drilling machine is also known having a table which can move along the usual Y-axis, on which can be arranged a series of boards, also of different dimensions. The drilling machine has a series of operating heads which can move along the usual X-axis independently of one another. In this way the heads can operate on boards of different dimensions and/or different distribution of the holes.

In particular, each head is provided with laterally projecting arms, which carry the support slides on the cross-piece for guiding the heads, and they are offset with respect to those of the adjacent head. Moreover, the guide cross-piece is provided with a fixed screw common to all the heads, whereas each head is provided with an electric motor which actuates a corresponding nut. In this way two or more heads can be used to carry out drilling on the same board, thereby increasing the productivity of the drilling machine.

This drilling machine has a number of disadvantages. Firstly, the construction of each head integrated with the displacing motor along the X-axis and with a nut is expensive and not very reliable in operation. Moreover, the arms carrying the support slides and the common screw extending over the entire length of the cross-piece are subject to elastic and thermal deformation, thereby giving rise to inaccuracy in machining. In turn, the cross-piece has to extend beyond the machining zone so as to provide a parking area for the heads which are sometimes inoperative.

SUMMARY OF THE INVENTION

The object of the invention is to devise a drilling unit which exhibits the highest degree of simplicity and operating safety, while obviating the above-mentioned drawbacks of known drilling machines.

This object is achieved by a drilling unit for printed circuit boards having two operating heads in accordance with the invention, said drilling unit comprising a board-holder table which can move on a base in a first direction, a cross-piece secured to said base, two carriages supporting said two operating heads and sliding on said cross-piece, and means for displacing said carriages independently of one another in a second direction perpendicular to said first direction, characterised in that said displacement means comprise two nut and screw pairs, each of which is associated with one of said carriages, the screw of each of said pairs being actuated by a corresponding reversible electric motor mounted on said cross-piece, the nut of each of said pairs being mounted on the corresponding carriage displaced outwards with respect to the corresponding operating head so as to allow said heads to move individually into a common machining zone on said table.

BRIEF DESCRIPTION OF THE DRAWINGS

With a view to a better understanding of the invention a preferred embodiment will be described non-restrictively by way of example below and with reference to the accompanying drawings, in which:

FIG. 3 is a section along the line III—III in FIG. 1;

FIG. 4 is a section along the line IV—IV in FIG. 2, on an enlarged scale;

FIG. 5 is a diagram, viewed from the front, of the drilling unit in an operating position;

FIG. 6 is a front view of a detail of FIG. 1, on an enlarged scale;

FIG. 7 is a section along the line VII—VII in FIG. 2, also on an enlarged scale.

DETAILED DESCRIPTION OF THE INVENTION

Figure 1:
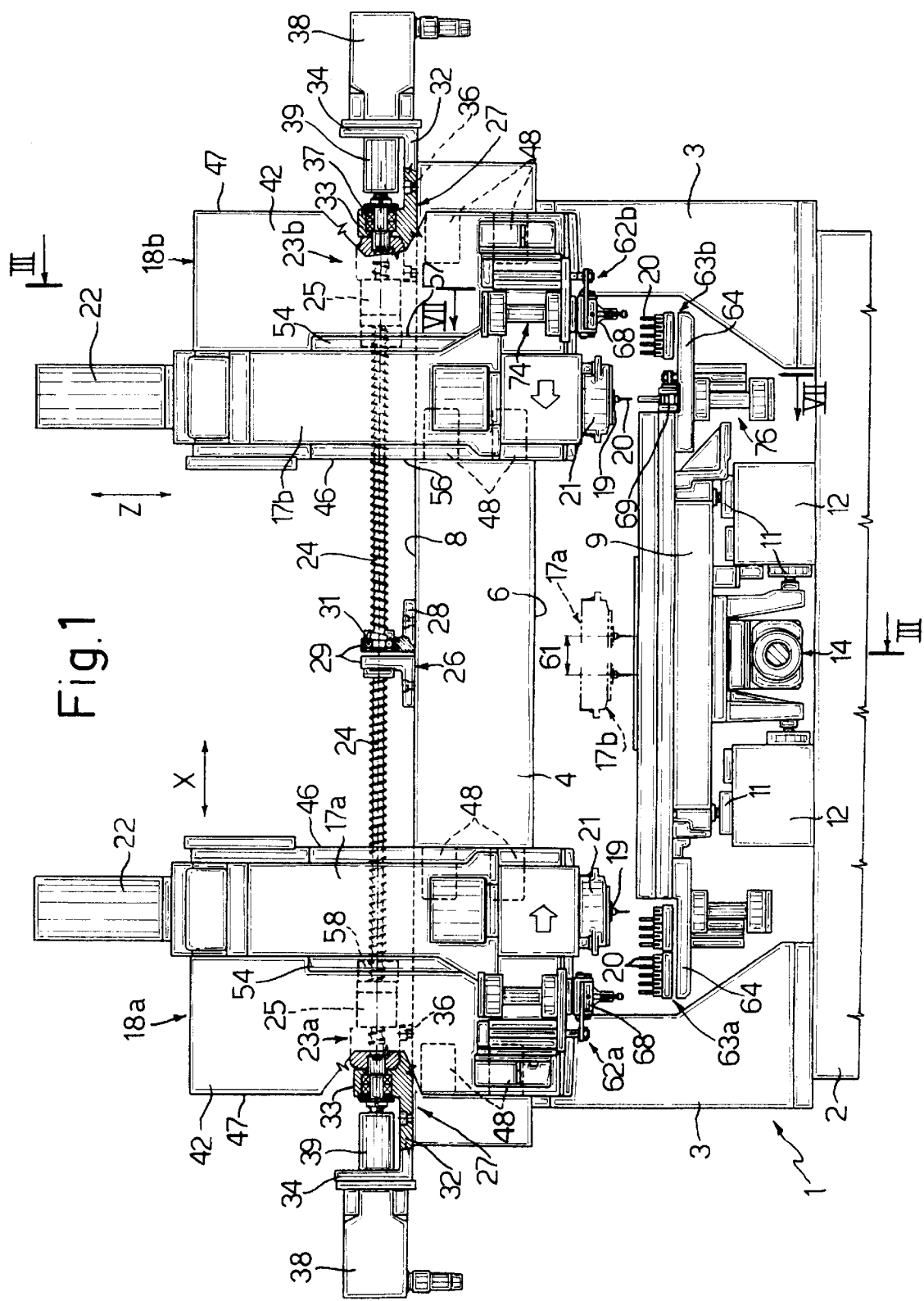
FIG. 1 is a front view, partly in section, of a drilling unit according to the invention.

Referring now to FIG. 1, the reference numeral 1 generally denotes a drilling unit which comprises a base 2, for example of granite, on which are secured two lateral uprights 3. A cross-piece 4 of granite is secured to these uprights 3 and is of rectangular or square cross-section and comprises a lower surface 6 (FIG. 4), two vertical surfaces 7 and an upper surface 8.

Figure 2:
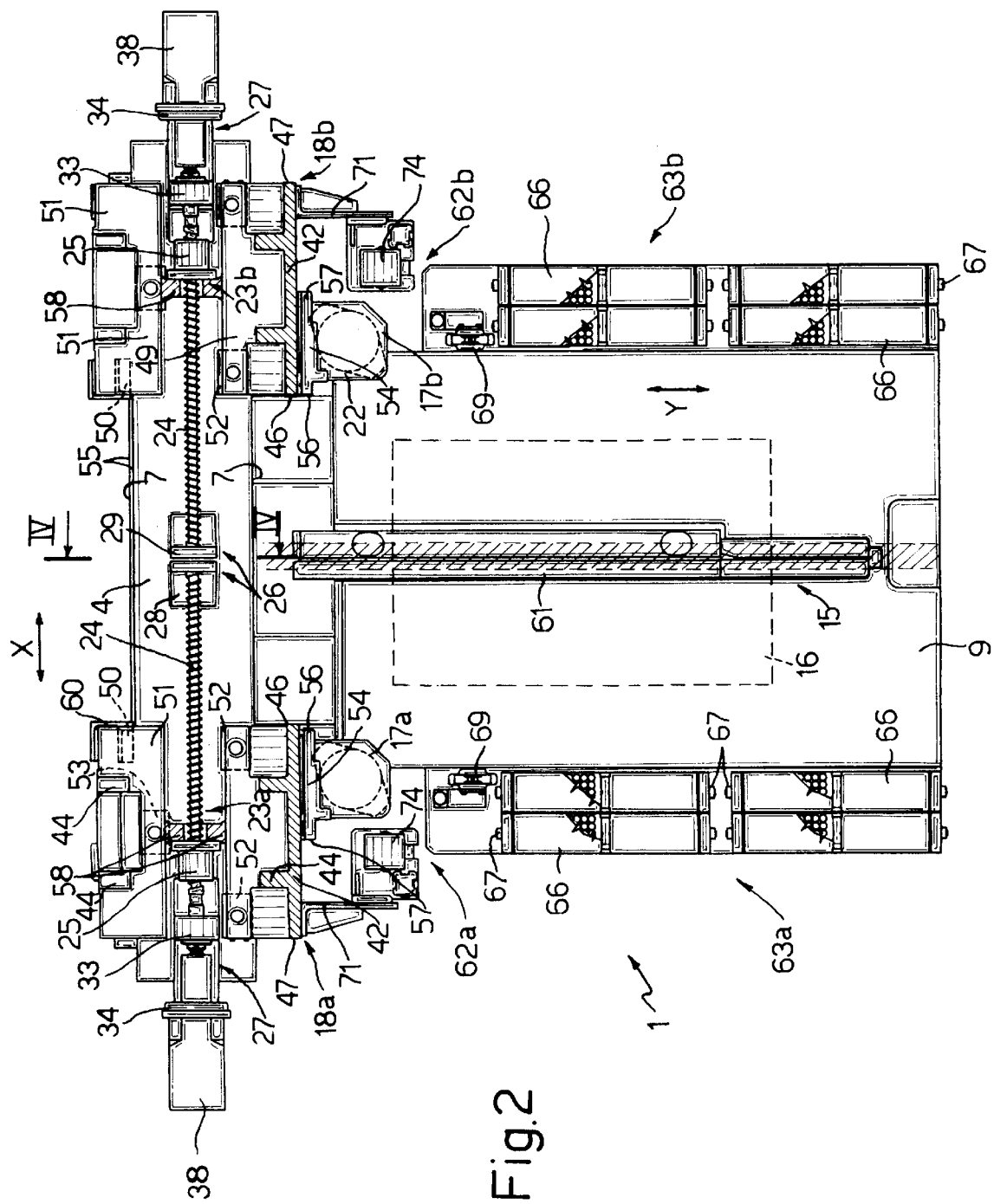
FIG. 2 is a view from above, partly in section, of the unit in FIG. 1.

The drilling unit 1 further comprises a board-holder table 9 provided with a series of air-cushion support slides 11 (FIG. 1) which are known per se and by means of which it can slide on two granite bars 12 extending in a first direction or Y-axis (FIG. 2). The table 9 is displaced along said Y-axis by means of a reversible electric motor of numerical-control type 13 (FIG. 3) via a nut and screw pair 14. The table 9 is further provided with a jig 15 for receiving and centering a pack 16 of printed circuit boards to be drilled.

The unit 1 further comprises two operating heads 17a and 17b (FIG. 1) supported by two corresponding carriages 18a and 18b which can slide on the cross-piece 4 in a direction perpendicular to the direction of displacement of the table 9, i.e. along the X-axis. Each head 17a,17b comprises a chuck 19 for actuating a tool or drill bit 20, and a per se known board-applying device 21. The chuck 19 is adapted to be moved vertically along the Z-axis by means of a reversible electric motor 22 of numerical-control type, substantially as described in the Applicant's own Patent Application No. T093A 000831.

According to the invention, the two carriages 18a,18b are displaced along the X-axis, independently of one another. For this purpose, the drilling unit 1 comprises two nut and screw pairs 23a,23b, each formed by a screw 24 and a nut 25. Each screw 24 is rotatable about a corresponding central support 26 and about a corresponding lateral support 27, both of which supports are mounted on the cross-piece 4. Each nut 25 is of recirculating-ball type and it secured to the corresponding carriage 18a,18b, as will be explained in more detail below. Advantageously, the two screws 24 are in alignment with one another.

Each central support 26 is formed by an L-shaped bracket and comprises a horizontal flange 28, by means of which it is secured to the upper surface 8 of the cross-piece 4, and a vertical flange 29 provided with a rolling bearing 31 for a cylindrical end of the screw 24. The two supports 26 (FIG. 2) are of much smaller width than that of the surface 8 of the cross-piece 4 and are situated opposite one another with the two vertical flanges 29 adjacent so as to reduce to a minimum the distance between the operative parts of the screws 24.

Each lateral support 27 (FIG. 1) comprises a horizontal plate 32 integral with two vertical and parallel respectively inner and outer flanges 33, 34. The horizontal plate 32 is secured by means of two screws 36 at the side end of the upper surface 8 of the cross-piece 4. The inner vertical flange 33 is provided with another rolling bearing 37 for the other end of the respective screw 24. The outer vertical flange 34 projects outwardly from the cross-piece 4 and carries a reversible electric motor 38 of numerical-control type mounted on its outer side, whereby it projects outwardly from the cross-piece 4. The shaft of the motor 38 is connected with the corresponding screw 24 via a per se known coupling 39 disposed between the two flanges 33 and 34.

Each carriage 18a,18b comprises a cast metal structure 41 (FIGS. 2 and 3) embracing the cross-piece 4. The structure 41 comprises two respectively front and rear vertical plates 42 and 43 connected by two robust ribs 44, each being of inverted U-shape. In particular, the front plate 42 has an inner lateral edge 46 (FIG. 1) and an outer lateral edge 47, which define the dimensions of the respective carriage 18a,18b along the X-axis.

Each vertical plate 42 and 43 (FIG. 4) has two pairs of air-cushion support slides 48 by means of which it is guided on the corresponding surface 7 of the cross-piece 4. The front plate 42 is also provided with two integral horizontal flanges 49, whereas the rear plate 43 is provided with two further horizontal integral flanges 51. The flanges 49 of the of the front plate 42 are each provided with two further support slides 52, whereas the flanges 51 of the rear plate 43 are each provided with at least one further support slide 53.

The slides 52 and 53 co-operate with the lower surface 6 and upper surface 8 of the cross-piece 4. Advantageously, the space between the two flanges 49 and 51 co-operating with the upper surface 8 (FIGS. 2 and 4) is greater than the width of the support 26. Therefore, each carriage 18a,18b can be displaced along the X-axis beyond the two supports 26 which can enter said space.

On the rear plate 43 of each support 41 there is mounted a conventional slider 50 of a position sensor for the feedback control of the corresponding motor 38. The two sliders 50 co-operate with a scale 55, for example of optical type, which is applied to the rear vertical surface 7 of the cross-piece 4. The two sliders 50 are arranged adjacent an edge 60 of the plate 43, facing towards the centre of the cross-piece 4.

Each head 17a, 17b (FIG. 2) is carried by a securing plate 54 by means of which it is secured to the front plate 42 of the structure 41 of the respective carriage 18a,18b. The plate 54 has two lateral edges 56,57, the distance apart of which defines the dimension of the head 17a, 17b along the X-axis. This dimension is much smaller than that of the respective carriage 18a,18b.

Advantageously, the plate 54 is secured so that its inner edge 56 is arranged in alignment with the inner edge 46 of the plate 42. Therefore, the two carriages 18a and 18b can be moved simultaneously towards the centre of the cross-piece 4 so as to bring the two edges 56 substantially in contact, as indicated by dashed lines in FIG. 5. In this way the distance at which the two heads 17a, 17b can operate simultaneously on the same pack 16 of printed circuit boards.

In turn, the nut 25 of each nut and screw pair 23a,23b is mounted on a U-shaped cross-piece 58 (FIG. 3) integral with the two upper flanges 49 and 51 of the structure 41. The cross-piece 58 is disposed outwardly with respect to the outer edge 57 (FIG. 2) of the plate 54 of the head 17a, 17b. Therefore, each carriage 18a,18b can be moved towards the centre of the cross-piece 4 until the cross-piece 58 is almost in contact with the flange 29 of the corresponding support 26, thereby reaching the positions indicated in dashed lines in FIG. 2. In that case the other carriage 18a,18b has to be displaced towards the corresponding end of the cross-piece 4.

In this way an overlap zone 61 of the table 9 is created, in which both the heads 17a, 17b can operate. Therefore, the holes needed for a pack 16 of printed circuit boards, disposed on the jig 15 of the table 9, can be drilled by progressively displacing the table 9 along the Y-axis so as to bring each positioning line of the holes in alignment with the two heads 17a, 17b, and by then displacing each head 17a, 17b transversely in alignment with the columns in which the holes of the line are required. Either one of the two heads 17a, 17b can be used for the holes in the zone 61, thereby balancing the number of holes which each head 17a, 17b has to produce in each line.

Each operating head 17a, 17b (FIGS. 1 and 2) is provided with a corresponding device 62a,62b for changing the tools 20, and with a corresponding tool magazine 63a,63b, in which the tools are arranged in a matrix in lines and in columns. Each magazine 63a,63b is disposed on a support 64 secured below the table 9 in the vicinity of the corresponding lateral edge of the head 17a, 17b. Therefore, the front and rear sides of the table 9 are completely clear and can be used for the automatic loading and unloading of the packs of boards 16.

Each magazine 63a,63b is formed by two rows of four containers 66 (FIG. 2), each designed to contain five rows of ten columns of tools 20. Each container 66 is mounted detachably in a corresponding seating by means of a locking screw 67. Each tool 20 (FIG. 1) is retained in the associated seating by an elastic clip, with its tang projecting upwardly.

Each tool-changing device 62a,62b comprises a first collet 68 arranged on the respective carriage 18a,18b, and a second collet 69 carried by the support 64 behind the associated magazine 63a,63b. In turn, the collet 68 is carried by a bracket 71 secured to the front plate 42 of the structure 41, on the outside with respect to the plate 54 of the respective head 17a, 17b, i.e in the vicinity of the outer edge 47 of the front plate 41 of the support 41. Therefore, the dimension of the carriage 18a,18b along the X-axis is greater than the sum of the dimensions of the head 17a, 17b and of the collet assembly 68.

Each collet 68 and 69 (FIGS. 6 and 7) is formed by a pair of jaws 72 carried by a pair of L-shaped levers 73, substantially as described in the Applicant's own Italian Patent No. 1.251.252. Advantageously, the pair of levers 73 of the collet 68 is disposed on a plane parallel to the X-axis, whereas the pair of levers 73 of the collet 69 is disposed on a plane parallel to the Y-axis.

Finally, the collet 68 is adapted to be displaced vertically by a pneumatic actuator 74 so as to remove a tool from the associated magazine 63a,63b, or from the collet, and to insert it therein. Analogously, the collet 69 is adapted to be displaced vertically by another pneumatic actuator 76 to remove a tool from the chuck 19, or from the collet 68, and to insert it therein.

To a change, firstly the used tool 20 (FIG. 1) is removed from the chuck 19. For this purpose, by moving the table 9 and the carriage 18a,18b, the chuck 19 is brought into alignment with the collet 69, the used tool 20 being transferred thereto. The collet 68 is then brought into alignment with the collet 69 and the used tool is transferred to the collet 68. Finally, the collet 68 is brought into alignment with the seating of the used tool 20 in the respective magazine 63a,63b, the used tool 20 being transferred to said seating.

To insert a new tool 20 into the chuck 19 the above-mentioned positioning and transfer operations are carried out in reverse order to that of the removal of the used tool 20 and, therefore, the description thereof will not be repeated.

The advantages of the drilling unit 1 according to the invention with respect to known drilling units are evident from the foregoing. In fact, productivity is increased very considerably in relation to drilling units with a single operating head. With respect to drilling machines with a plurality of operating heads, which are displaced along the X-axis by means of a common fixed screw and motors carried by the respective operating heads, the production costs are reduced very considerably and the reliability and accuracy of operation are increased.

It is evident that the drilling unit described can be subject to various modifications and variations without departing from the scope of the claims. For example, the two screws 24 for moving the two carriages 18a,18b can be parallel to one another rather than in alignment. Moreover, the screws 24 and the scale 55 can be connected to other surfaces of the cross-piece 4.

In turn, the tool magazine can be of drum type and it may contain at least a certain number of milling tools rather than drilling tools. Finally, the tool-changing device may comprise two collets both disposed on the table, or a single movable collet so as to exchange the tool between the chuck and the magazine.

I claim:

1. A drilling unit for printed circuit boards having two operating heads (17a,17b), comprising a board-holder table (9) which can move on a base (2) in a first direction (Y), a cross-piece (4) secured to said base (2), two carriages (18a,18b) supporting said two operating heads (17a,17b) and sliding on said cross-piece (4), and means (23a,38; 23b,38) for displacing said carriages (18a,18b) independently of one another in a second direction (X) perpendicular to said first direction (Y), characterised in that said displacement means (23a,38; 23b,38) comprise two nut and screw pairs (23a,23b), each of which is associated with one of said carriages (18a,18b), the screw (24) of each of said pairs (23a,23b) being actuated by a corresponding reversible electric motor (38) mounted on said cross-piece (4), the nut (25) of each of said pairs (23a,23b) being mounted on the corresponding carriage (18a,18b) displaced outwards with respect to the corresponding operating head (17a,17b) so as to allow said heads (17a,17b) to move individually into a common machining zone (61) on said table (9).

2. A drilling unit according to claim 1, characterised in that each of said heads (17a,17b) is mounted on the associated carriage (18a,18b) substantially aligned on one edge (46) of said carriage (18a,18b) facing towards the other carriage (18a,18b) so as to reduce to a minimum the separation between said heads (17a,17b).

3. A drilling unit according to claim 1, characterised in that each of said motors (38) is mounted in alignment with one end of said cross-piece (4).

4. A drilling unit according to claim 3, characterised in that said two screws (24) are coaxial and are mounted rotatably on two pairs of supports (26,27) carried by said cross-piece (4), the inner supports (26) of the two pairs (26,27) being L-shaped and being situated opposite one another.

5. A drilling unit according to claim 4, characterised in that the other support (27) of each pair (26,27) is disposed on said end of the cross-piece and is provided with an element (34) on which the corresponding motor (38) is mounted to project towards the outside of said cross-piece (4).

6. A drilling unit according to claim 4, in which said cross-piece (4) is of substantially rectangular section, characterised in that each of said carriages (18a,18b) comprises a structure (41) having two parallel plates (42,43) connected by two U-shaped ribs (44) so as to be guided on two parallel surfaces (7) of said cross-piece (4), each of said plates (42,43) being provided with two flanges (49,51) guided on two other parallel surfaces (6,8) of said cross-piece (4).

7. A drilling unit according to claim 6, characterised in that said supports (26,27) are mounted on a predetermined surface (8) of said other surfaces (6,8), the corresponding flanges (49,51) of said plates (42,43) guided by said predetermined surfaces being spaced apart by a distance which allows the passage of said inner supports (26).

8. A drilling unit according to claim 7, characterised in that said parallel plates (42,43) are vertical, one plate (42) being at the front and the other (43) being at the rear with respect to said cross-piece (4), said predetermined surface being the upper surface (8) of said cross-piece (4).

9. A drilling unit according to claim 6, characterised in that said nut (25) is secured to a pair of extensions (58,59) of said flanges (49,51) on the outside with respect to the associated head (17a,17b).

10. A drilling unit according to claim 6, characterised in that on one of the surfaces (6,7,8) of said cross-piece (4) there is applied a scale (55) of a position sensor common to said heads (17a,17b), one (43) of said plates (42,43) of each of said structures (41) having a slider (50) adapted to co-operate with said scale (55), said slider (50) being arranged adjacent to an edge (60) of said plate (43) facing towards the centre of said cross-piece (4).

11. A drilling unit according to claim 1, comprising for each of said heads (17a,17b) a tool-changing device (62a, 62b), and a magazine (63a,63b) for tools (20) carried by said table (9), said tools (2) being arranged in a matrix in lines and in columns, characterised in that each of said magazines (63a,63b) is in the form of a plurality of interchangeable containers (66), disposed in at least one row along a lateral edge of said table (9).

12. A drilling unit according to claim 11, in which each of said tool-changing devices (62a, 62b) comprises a first collet (68) for gripping a tool (20), which is carried by the corresponding carriage (18a,18b) to remove a tool (20) from said corresponding magazine (63a,63b), or a second collet (69), to insert it therein, said second collet (69) being disposed on said table (9), characterised in that on each of said carriages (18a,18b) said first collet (68) is disposed on the outside of said head (17a,17b ), said second collet (69) being disposed behind the corresponding magazine (63a,63b ).

13. A drilling unit according to claim 12, characterised in that said first collet (68) is supported by a bracket which is secured to said carriage (18*a*,18*b* ) and which is in alignment with an outer edge (47) of said front plate (42).

14. A drilling unit according to claim 10, in which each of said collets (68,69) comprises a pair of jaws (72) carried by a pair of L-shaped levers (73) arranged symmetrically with respect to each other, characterised in that the levers (73) of said first collet (68) are positioned at an angle of 90° with respect to the levers (73) of said second collet (69).

\* \* \* \* \*